United States Patent [19]

Zory et al.

[11] 4,240,098
[45] Dec. 16, 1980

[54] SEMICONDUCTOR OPTOELECTRONIC DEVICE PACKAGE

[75] Inventors: Peter S. Zory, Ossining; Frederick W. Scholl, Riverdale; Harry F. Lockwood, New York, all of N.Y.

[73] Assignee: Exxon Research & Engineering Co., Florham Park, N.J.

[21] Appl. No.: 946,592

[22] Filed: Sep. 28, 1978

[51] Int. Cl.³ .............. H01L 23/02; H01L 23/12; H01L 39/02
[52] U.S. Cl. ........................... 357/74; 357/17; 357/80; 357/81; 333/246; 333/247
[58] Field of Search .............. 357/65, 17, 74, 81, 357/82, 80; 333/246, 247

[56] References Cited

U.S. PATENT DOCUMENTS

| 3,577,181 | 5/1971 | Belohoubek | 357/84 |
|---|---|---|---|
| 3,769,560 | 10/1973 | Miyake et al. | 357/74 |
| 3,857,115 | 12/1974 | Wisbey | 357/74 |
| 3,908,188 | 9/1975 | Kawamoto | 357/82 |
| 3,913,040 | 10/1975 | Rosen et al. | 357/81 |
| 3,946,416 | 3/1976 | Hacskaylo | 357/65 |
| 3,946,428 | 3/1976 | Anazawa et al. | 357/81 |
| 4,097,891 | 6/1978 | Selway et al. | 357/17 |
| 4,144,504 | 3/1979 | Leggett et al. | 357/81 |
| 4,150,393 | 4/1979 | Wilson et al. | 357/74 |

Primary Examiner—Andrew J. James

[57] ABSTRACT

A new package for semiconductor optoelectronic devices is disclosed, which comprises a novel geometrical configuration and provides plug-in capability. The package configuration provides a convenient means for supplying electrical signals to or from the device(s) within the package while maintaining a coaxial geometry, useful in optical and thermal control. Techniques for bonding devices into the package are easily automated using conventional bonding and assembly equipment. The package permits use of the device in a variety of orientations.

21 Claims, 8 Drawing Figures

SEMICONDUCTOR OPTOELECTRONIC DEVICE PACKAGE

BACKGROUND OF THE INVENTION

1. Field of the Invention

The invention relates to a semiconductor optoelectronic device (e.g., a laser diode or light emitting diode) package. The device package permits external electrical contact while maintaining a coaxial package geometry convenient for good heat sinking and light coupling to and from device(s) within the package.

2. Description of the Prior Art

Semiconductor optoelectronic devices are bodies of semiconductor material which include regions of opposite conductivity type forming a p-n junction therebetween. For some classes of devices, such as diode lasers and light emitting diodes, when an external voltage is properly applied to the p-n junction, light is generated internally through the recombination of pairs of oppositely charged carriers. For other classes of devices, such as photodetectors, when light (photons) strike the surface, electron-hole pairs are formed, generating an external voltage.

A stud mount coaxial package of the type commonly employed in commercial usage of a semiconductor optoelectronic device is disclosed in U.S. Pat. No. 3,869,702. There, one side of a light emissive semiconductor device is mounted onto a copper block which in turn is secured on one face of a steel stud having a hole therein. A hollow stem protruding from the opposite face of the stud permits passage of a wire through the hollow stem for providing the other connection for the semiconductor device. The wire is electrically insulated from the hollow stem. However, bonding of the device to the wire is generally done by "flying lead" bonding or hand soldering procedures, neither of which can easily be automated. Second, the package is limited by its geometry in the ways in which it can be mounted on, for example, a printed circuit board or in which it can be adapted to readily available connectors. Typically, at least one lead of the package must be soldered to an external connection. Such soldering, with its attendant heat, can degrade the device.

SUMMARY OF THE INVENTION

In accordance with the invention, a package for semiconductor optoelectronic devices is disclosed. The package includes a device mount, which provides (1) support for at least one optoelectronic device, (2) electrical connections thereto and (3) means for removing heat generated during operation of the device. The device mount comprises a metallic stud of high thermal conductivity and an elongated insulator tab, a portion of the bottom of which is mounted on the top of the stud. The insulator tab is provided with (1) an opening at the mounted end to expose a portion of the top of the stud and (2) electrically conducting paths in the elongation direction on both the top and bottom. The bottom conducting path provides electrical contact to the stud. The top conducting path terminates at the opening.

The package of the invention comprises the device mount, together with (1) a block of high thermal conductivity, which is mounted through the opening in the insulator tab and electrically attached to the top of the stud and (2) an isolation pad configured on one side of the block, at least a portion of which supports an electrically conducting coating which is electrically connected to at least one of the top conducting paths on the insulator tab and electrically insulated from the block. A semiconductor optoelectronic device which has adjacent regions of opposite conductivity to form a p-n junction is mounted on the block above the isolation pad, with one of the regions being electrically and thermally connected to the block and the other region being electrically connected by a wire lead to the conducting portion of the isolation pad.

The right angle electrical contact between the isolation pad and the top conducting path on the insulator tab is one key feature of the invention. Geometrical (mechanical) contact is achieved by virtue of the package design. The electrical contact can be made using conductive epoxy, solder cream, or solder preform. This process is a significant improvement over hand wire bonding or flying lead techniques, which are not easily automated. In contrast, the contact arrangement described in the present invention can easily be automated.

Further, in practice, the isolation pad is first configured on the block, followed by mounting of the device. After attaching the lead, the device can be readily tested by making connections, such as by test probes, to the block and isolation pad. In this manner, quality control of the devices may be effected at an earlier stage of packaging than heretofore possible, with consequent savings on process time and energy. Devices which pass testing are then packaged by mounting the block on the stud, as described above.

The package provides a simple means of maintaining coaxial geometry. Each step in the assembly of the package is easily automated, and the finished package can be mounted in a variety of ways so as to achieve light output in a desired direction while maintaining a coaxial geometry. In particular, the package of the invention provides plug-in capability, without the need for soldering to leads.

DETAILED DESCRIPTION OF THE INVENTION

The semiconductor optoelectronic devices which may be beneficially packaged in accordance with the invention include those semiconductor devices which either upon electrical stimulation emit light or upon excitation by incident light generate an electrical signal.

The light may be in the UV, visible or IR regions. Exemplary of the former class of devices are diode lasers and light emitting diodes. Exemplary of the latter class of devices are photodetectors. The discussion which follows is given generally in terms relating to light-emitting devices. However, it will also be understood that the elements of the package of the invention apply as well to light-absorbing devices.

The semiconductor optoelectronic devices especially contemplated for use in the invention are those light-emitting devices such as diode lasers or high radiance light emitting diodes. As is well-known, such devices comprise adjacent regions of opposite conductivity forming a p-n junction. Electrical connection is made to each of the regions for operation of the device. Most preferred devices contemplated for use in the invention are the well-known double heterostructure diode lasers formed from multiple layers of gallium arsenide and gallium aluminum arsenide deposited on an n-GaAs substrate. The processes and various device configurations are well-known and do not form a part of this invention. The substrate and cap p-GaAs layer of such devices are typically metallized. In packaging such devices, the metallized n-GaAs substrate is commonly connected to a first electrical connection (cathode) while the metallized p-GaAs layer is bonded to a second electrical connection (anode) in conjunction with a heat sink for dissipating heat generated during operation of the device.

Figure 1A:
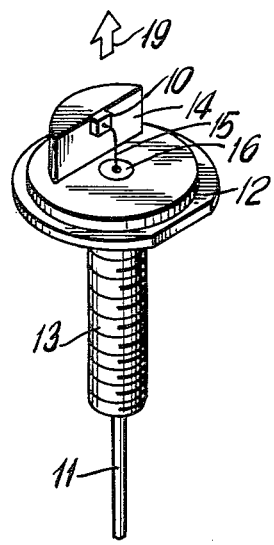
FIGS. 1a and 1b illustrate a prior art package for a diode laser.

FIG. 1a shows a prior art package, shown here about 3× actual size, for a diode laser 10. The package includes a wire 11, which serves as a cathode, and a stud 12, to which is attached a hollow, threaded portion 13, which serves as an anode and through which wire 11 passes. The threaded portion permits easy fitting in a fastening device or otherwise mounting on a circuit board to a first electrical connection. The free end of wire 11 is typically soldered to a second electrical connection. The package also includes the semiconductor optoelectronic device 10, such as a gallium aluminum arsenide diode laser, one end (generally p-side) of which is mounted on block 14. Block 14 is electrically and thermally connected to the top of stud 12. The end of the device not connected to the block (generally n-side) is connected to the wire 11 through lead 15. A glass insulating region 16 provides electrical insulation between wire 11 and stud 12.

Figure 1B:
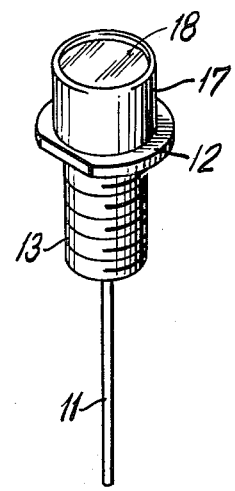

In FIG. 1b, the package of FIG. 1a is shown together with a cap 17 fitted with a transparent window 18, providing a seal around the diode laser. The transparent window permits egress of optical radiation 19 generated by the diode laser.

Lead 15 is commonly referred to as a "flying lead", inasmuch as two separate steps are required for attaching both ends of the wire. One end is typically bonded at one station, and the other end is bonded at a second station, due to the requirement of making a right angle connection, as shown in FIG. 1a.

As can be seen from the prior art device, optical output is approximately coaxial with electrical input, but the package can only be easily mounted such that optical output is perpendicular to the mounting surface, such as a printed circuit board.

Figure 2:
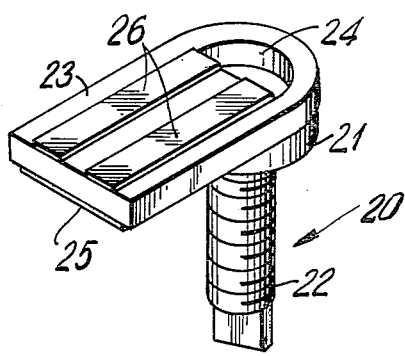
FIG. 2 depicts a device mount of the invention, comprising a metallic stud and an elongated insulator tab.

A mount, shown here about 3× actual size, for a semiconductor optoelectronic device in accordance with the invention is illustrated in FIG. 2, which shows a stud 20 comprising a pedestal 21 and a screw portion 22. The stud and pedestal form a heat sink for dissipating heat generated by the device during operation, and thus comprise a high thermal conductivity material such as copper. For protection against corrosion, the stud may be coated with a noble metal such as gold or nickel/gold, as is customary in the art.

To the top of the pedestal is mounted an elongated insulator tab 23. The insulator tab may be of any electrically insulating material, such as ceramic, and is preferably electronic grade alumina. A portion of the bottom of the insulator tab is mounted to the stud by brazing or soldering. A portion of the end of the insulator tab which is mounted on the stud is provided with an opening 24 to expose a portion of the top of pedestal 21. The opening is conveniently D-shaped.

On the bottom surface of the insulator tab is formed a conducting surface, or path, 25 which is electrically connected to the stud and may be considered to be a ground connection. On the top of the insulator tab is formed at least one electrically conducting path 26 which, like path 25, runs in the direction of elongation. The electrical conducting path 26 terminates at the rim of opening 24. At least one path is required in order to make connection to devices contemplated for packaging in accordance with the invention. A second, electrically independent and geometrically parallel path may be provided, as shown, where more than one device is employed, such as, for example, where a second device is used for modulation or to provide feedback or other related use in conjunction with the first device. As is well-known, such second evice will ordinarily share a common ground with the diode laser, but the two positive connections will be electrically insulated from each other; see, e.g., U.S. Pat. No. 4,101,847. Alternatively, the second conducting path may be provided as a redundant back-up contact for the first device. The dimensions of the insulator tab and paths 25 and 26 are conveniently selected for use in edge connectors, which have standardized pin spacings.

The conducting paths 25 and 26 are of materials that are either easily solderable or otherwise bonded to in some fashion or else can withstand insertion into wiping contacts such as conventional edge connector pin contacts. Reference to use of the package of the invention in connection with either of these approaches is discussed more fully in connection with FIGS. 6 and 7 below. A convenient material which meets such requirements is formed by screening a molybdenum/manganese composition onto the ceramic tab in the desired pattern, firing at an elevated temperature, followed by plating with gold or nickel/gold. These procedures are well-known in the art and form no part of this invention.

Figure 3:
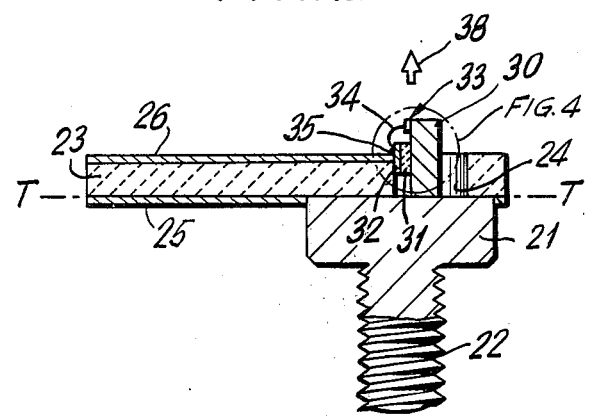
FIG. 3, in cross-section, depicts a semiconductor optoelectronic device package of the invention.
Figure 4:
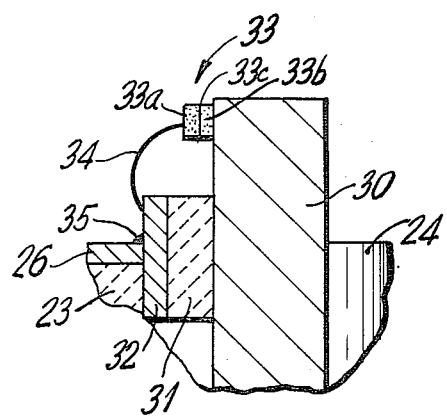
FIG. 4 is an enlarged view of the encircled portion of FIG. 3.

The semiconductor optoelectronic package of the invention is formed, as illustrated in FIGS. 3 and 4, by mounting a block 30 through opening 24 onto pedestal 21 of the device mount shown in FIG. 2. The block provides a path for both electrical and heat transfer and accordingly is of a high electrical and thermal conductivity material, such as copper, silver or metallized beryllia. The block is attached to the pedestal by well-known bonding techniques which provide paths for both electrical and heat transfer. Examples of such bonding techniques include bonding with conducting epoxy, e.g., silver epoxy, soldering, and brazing.

Prior to attaching the block to the pedestal, an isolation pad 31 is configured on the block. The pad may be discrete, as shown in FIGS. 3 and 4 and may be mounted on a portion of the block by solder, epoxy or similar means. If an electrically insulating, heat conducting ceramic such as beryllia is employed as the block, the isolation pad may be formed by defining an electrically conducting area separate from any other electrically conducting area on the block.

A discrete isolation pad may be of any electrically insulating material, such as ceramic, and is preferably electronic grade alumina. At least a portion of one surface (top) is provided with an electrically conducting coating 32; the opposite surface (bottom) may or may not be provided with a metallized coating. The coatings may be formed in the same manner and comprise the same materials as the conducting paths 25 and 26 on the insulator tab.

On the upper portion of block 30 is mounted a semiconductor optoelectronic device 33 having regions of opposite conductivity 33a and 33b, forming a p-n junction 33c. the device is mounted in proximity to the isolation pad, usually about 50 μm away, for convenient interconnection.

The block is conveniently coated with indium, tin or other low melting metal or alloy (not shown) prior to configuring the isolation pad and mounting the device, since the device (and discrete isolation pad, if provided with a metallized coating on its bottom) may then be easily soldered to the block. The thickness of the metallized coating ranges from about 2 to 4 μm. The indium coating renders the soldering operation quite reproducible and is readily adaptable to batch processing. The indium or other low melting metal or alloy is applied to the block by electroplating or vapor deposition, over a film of nickel or other barrier metal (about 0.5 μm) deposited on the block as a barrier layer to prevent diffusion of copper into the device.

If block 30 comprises a heat conducting, electrically insulating material, such as beryllia, then isolation pad 31 may be configured on the block by leaving a portion of the block at the appropriate location uncoated with the solderable film. Alternatively, a portion of the solderable film may be removed to configure the isolation pad. In any event, a portion of the isolation pad may then be coated with the electrically conducting coating 32, as described above, in such a manner as to be electrically insulated from any conducting coating on the block.

Forming both the isolation pad and the device on the block permits easy attachment of lead 34, one end of which is bonded to device 33 and the other end of which is bonded to the conducting portion 32 of the isolation pad. Standard wire bonding techniques, such as ultrasonic or thermocompression bonding, are conveniently employed in bonding lead 34. As can be seen from the Figures, both ends of lead 34 are in parallel planes in the same dimension and require no reorientation of the package to bond both ends. Consequently, the bonding operation is readily automated and may be done at one station.

Block 30 and its associated components are then mounted in opening 24, as discussed above. Connection of conducting portion 32 to conducting path 26 is then made employing electrically conducting means 35, such as conducting epoxy, solder cream or solder preform. Details of the mounting of the block and its associated components are shown more clearly in FIG. 4, which is an enlargement of the encircled portion of FIG. 3.

Figure 5:
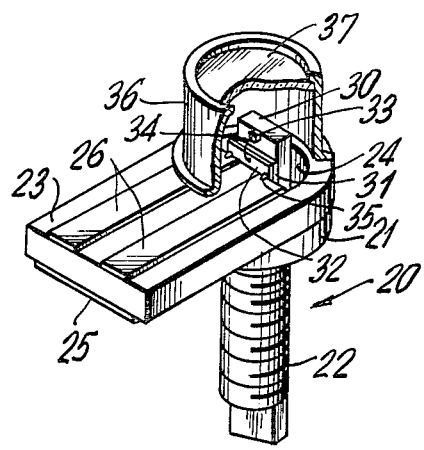
FIG. 5 illustrates a perspective view, partially broken away, of the package shown in FIG. 3, with attached cap seal.

As with prior art devices, a seal may be provided, as shown in FIG. 5. A cap 36 with window 37, which is substantially transparent to the radiation emitted (or absorbed) by the device, is centered around the periphery of opening 24 and attached, such as with an epoxy. If electrical isolation of a metallic cap from conducting paths 26 is desired, a non-conducting epoxy may be employed. Alternatively, the cap may be of ceramic or other insulative material.

A hermetic seal may be formed by a slight modification of the insulator tab. For example, one modification (not shown) comprises forming a ceramic or other insulating ring around opening 24, having the same diameter as cap 36, and crossing over conducting paths 26. The top surface of the ring is then metallized by conventional techniques, and the cap is bonded, as by welding or soldering, to the metallized ring.

The package of the invention provides a simple means of maintaining a substantially coaxial configuration of a semiconductor optoelectronic device. Stimulated emission 38 (or absorbed radiation) travels in a direction perpendicular to the thermal reference plane TT (shown in FIG. 3), which is part of a heat sink, such as a chassis, conductive circuit board or other heat spreading device. All steps in the assembly procedure are easily accomplished and easily automated.

Packaging optoelectronic devices in accordance with the invention provides another benefit. In the sequence of processing, the isolation pad 31 is first configured on the block 30, then one portion of the device 33 is bonded to the block above the isolation pad. The lead 34 is then attached connecting the other portion of the device and isolation pad. At this point, the device may be readily tested by making connections, such as by test probes, to the block and isolation pad. Devices which fail such testing may thus be screened out earlier than heretofore possible, with consequent savings on process time and energy. Devices which pass such testing may then be packaged by mounting the block onto pedestal 21, as described above.

Figure 6:
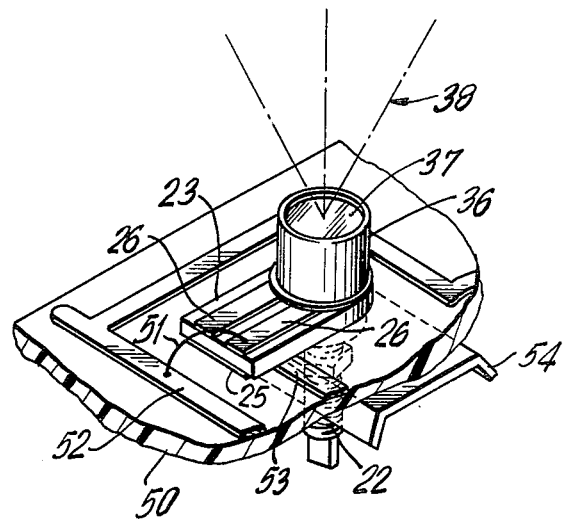
FIG. 6 depicts an example of mounting the package of the invention on a printed circuit board for emission (or absorption) of an optical beam perpendicular to the plane of the circuit board.
Figure 7:
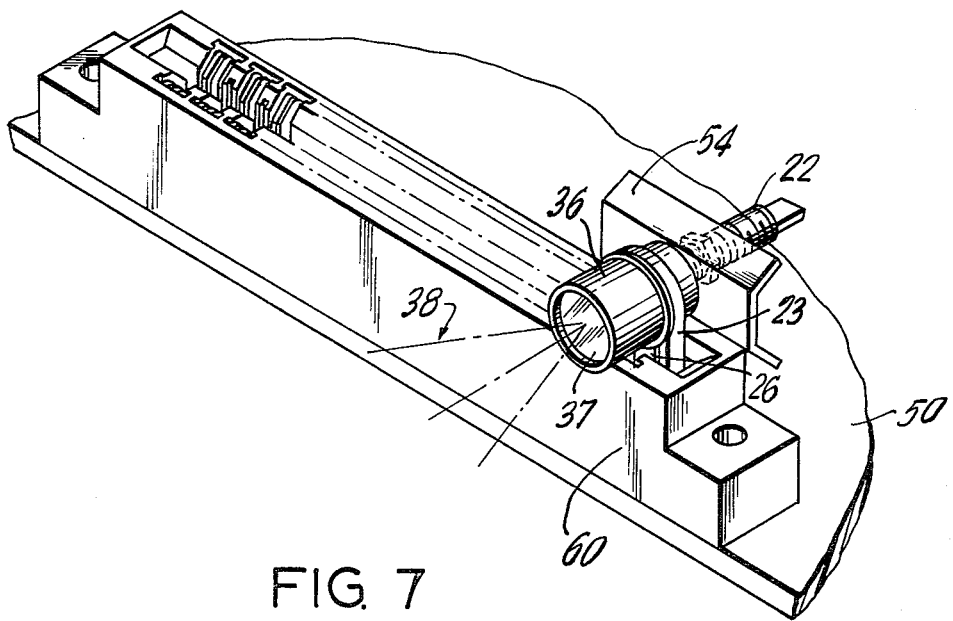
FIG. 7 depicts an example of mounting the package of the invention on a printed circuit board for emission (or absorption) of an optical beam parallel to the plane of the circuit board.

The plug-in capability provided by the package of the invention permits mounting the package in a number of different orientations. FIGS. 6 and 7 demonstrate two possible ways of mounting the package, although there are other ways as well. For example, as shown in FIG. 6, the package may be bolted to a printed circuit board 50 and at least one lead 51 conventionally bonded between at least one conducting path 26 and a first electrical contact 52 to make electrical connection thereto. Conducting path 25 on the bottom of insulator tab 23 may make compressive contact to a second electrical contact 53 on the printed circuit board to complete the circuit. A heat sink 54 may be employed as part of the attachment to screw portion 22. Output (or incident) beam 38 is then perpendicular to the plane of the printed circuit board.

Another configuration more convenient for changing components is shown in FIG. 7. A conventional edge connector 60 is attached to printed circuit board 50 with circuit paths (not shown). Such connectors comprise a plurality of wiping contacts for insertion of devices and a corresponding plurality of pin connections for external electrical connection, as is well-known. In this configuration, the output (or input) beam 38 is emitted (or absorbed) parallel to the plane of the printed circuit board, which is convenient for the usual stacked parallel array of printed circuit boards. A heat sink 53 can also be attached to screw portion 22 as desired.

EXAMPLE

An elongated insulator tab of electronic grade $Al_2O_3$ having the configuration shown in FIG. 2 was constructed with a D-shaped opening at one end. The top and bottom of the tab were metallized in the pattern depicted in FIG. 2, employing a layer of Mo-Mn of 0.5 mils thick formed by firing directly on the ceramic, followed by a plated layer of at least $1 \times 10^{-4}$ inch Ni and a plated layer of at least $5 \times 10^{-5}$ inch Au. A copper stud, comprising pedestal and screw portions and coated by plated layers of Ni and Au of about the same thickness as above, was silver brazed to the bottom of the insulator tab, such that a portion of the top of the pedestal was exposed through the opening.

A copper block was plated with 0.5 $\mu$m Ni, followed by 2 $\mu$m In. An isolation pad of electronic grade $Al_2O_3$, metallized top and bottom with nickel and gold, of about the same thicknesses as the metallized layers on the insulator tab, was attached to the block by soldering. The p-side of a (Ga,Al)As double heterostructure diode laser was attached by soldering to the top edge of the copper block, on the same side as the isolation pad, about 50 $\mu$m away. One end of a wire lead (Au; diameter 1 mil) was attached to the n-side of the device, and the other end to the exposed top of the isolation pad, employing conventional ultrasonic wire bonding.

The copper block, with mounted device connected to isolation pad, was placed in a jig provided with two test probes for making contact to the copper block and isolation pad. Following successful evaluation of the device, the block was mounted through the opening of the insulator tab on the top of the copper stud using silver epoxy, with the block and associated components substantially configured as shown in FIGS. 3 and 4. Electrical connection was made between the isolation pad and the metallized paths on top of the insulated tab using silver epoxy.

Finally, a metal cap having a transparent window on top was attached around the opening of the insulator tab, employing a non-conducting epoxy. The completed package was then mounted in an edge connector similar to that shown in FIG. 7 and to which electrical connection was made. The packaged diode laser was then subjected to further testing and evaluation.

What is claimed is:

1. A semiconductor optoelectronic device package comprising:
   (a) a metallic stud comprising pedestal and screw portions of high thermal conductivity material;
   (b) an elongated insulator tab, a portion of the bottom of which is mounted on top of said stud, said insulator tab provided with (1) an opening therethrough at the mounted end, (2) an electrically conducting path along the bottom of said insulator tab, perpendicular to and making electrical contact to said stud and (3) at least one electrically conducting path on the top of said insulator tab, perpendicular to an axial plane of said stud, terminating at said opening;
   (c) a block comprising high thermal conductivity material including
      (1) at least one isolation pad configured on said block, at least a portion of which supports an electrically conducting coating, insulated from said block and
      (2) at least one optoelectronic semiconductor device comprising adjacent regions of opposite conductivity forming at least one p-n junction and mounted on said block, one of said regions being electrically and thermally connected to said block, another of said regions being electrically connected to said conductive portion of said isolation pad, said block being mounted through the opening in the insulator tab and attached to the top of said stud to provide electrical and thermal conductivity therebetween, said block being positioned relative to said stud to provide light propagation to or from said semiconductor device in a direction substantially coaxial with the stud and positioned relative to said insulator tab such that at least one of the top conducting paths is proximate to the conductive layer on said isolation pad.

2. The package of claim 1 further comprising a cap with a window substantially transparent to radiation emitted or absorbed by said at least one device, said cap secured to said insulator tab around said opening to form a sealed enclosure for said device.

3. The package of claim 1 in which said stud and said block consist essentially of copper.

4. The package of claim 3 in which said stud is coated with at least one conducting metallic film comprising a noble metal.

5. The package of claim 1 in which at least a portion of said block is coated with at least one film comprising a solderable metal.

6. The package of claim 1 in which said insulator tab consists essentially of alumina.

7. The package of claim 1 in which said electrically conducting paths along said top and bottom of said insulator tab and in which said conducting coating on said isolation pad comprise at least one film comprising a noble metal.

8. The package of claim 1 in which said isolation pad comprises a body consisting essentially of alumina, the bottom of which is mounted on one side of said block and at least a portion of the top of which supports said electrically conducting coating.

9. The package of claim 1 in which said at least one device comprises a multi-layer double heterostructure gallium aluminum arsenide light-emitting device.

10. A light-emitting device package comprising:
   (a) a copper stud comprising a pedestal and screw portion plated with a first film consisting essentially of nickel and a second film over said first film consisting essentially of gold;
   (b) an elongated insulator tab consisting essentially of alumina, a portion of the bottom of which is mounted on top of said stud, said insulator tab provided with (1) an opening therethrough at the mounted end, (2) an electrically conducting path consisting essentially of a gold film over a layer consisting essentially of molybdenum/manganese along the bottom of said insulator tab making electrical contact to said top of said stud and (3) at least one electrically conducting path consisting essentially of a gold film over a layer consisting essentially of molybdenum/manganese along the top of said insulator tab in the direction of elongation and terminating at said opening;
   (c) a copper block coated with a solderable film consisting essentially of indium over a layer consisting essentially of nickel mounted through said opening in said insulator tab and electrically attached to the top of said stud;

(d) an isolation pad consisting essentially of alumina, the bottom of which is mounted on one side of said block and at least a portion of the top of which supports an electrically conducting coating consisting essentially of a gold film over a layer consisting essentially of molybdenum/manganese which is electrically connected to at least one of said top conducting layers on said insulation tab and electrically isolated from said block said block together with said pad being positioned such that the top electrically conducting path on said insulator tab is proximate and perpendicular to the conducting coating on said isolation pad;

(e) a multi-layer semiconductor light-emitting device having regions of opposite conductivity forming a p-n junction mounted on said block in proximity to said isolation pad, one of said regions being electrically and thermally connected to said block, the other of said regions being electrically connected to said electrically conducting coating on said isolation pad, said light emitting device positioned to provide light propagation to or from said device in a direction substantially coaxial to said stud;

(f) a cap with a window substantially transparent to radiation emitted by said device, said cap secured to said insulator tab around said opening to form a sealed enclosure for said device.

11. The package of claim 10 in which the p-side of said device is connected to said block and the n-side is connected to said electrically conducting coating on said isolation pad.

12. A device mount comprising:
(a) a metallic stud comprising pedestal and screw portions of high thermal conductivity; and
(b) an elongated insulator tab, a portion of the bottom of which is mounted on top of said stud, said insulator tab provided with (1) an opening therethrough at the mounted end, (2) an electrically conducting layer along the bottom of said insulator tab making electrical contact to said stud and (3) at least one electrically conducting layer along the top of said insulator tab, perpendicular to the axial plane of the metallic stud terminating at said opening in the insulator tab; and
(c) a block of high thermal conductivity for supporting a device, said block mounted through said opening in said insulator tab and permitting light egress to said device, said block being electrically attached to said top of said stud; and
(d) an isolation pad configured on said block, at least a portion of which supports an electrically conducting coating which is electrically connected to at least one of said top conducting layers on said insulator tab and electrically insulated from said block.

13. The mount of claim 12 in which said stud is further coated with at least one conducting metallic film comprising gold.

14. The mount of claim 12 in which at least a portion of said block is coated with at least one film comprising indium.

15. The mount of claim 11 in which said insulator tab consists essentially of alumina.

16. The mount of claim 11 in which said electrically conducting layers along said top and bottom of said insulator tab and in which said conducting coating on said isolation pad comprise at least one film comprising gold.

17. The mount of claim 12 in which said isolation pad comprises a body consisting essentially of alumina, the bottom of which is mounted on one side of said block and at least a portion of the top of which supports said electrically conducting coating.

18. The package of claim 9 comprising two electrically conducting paths on the top of said insulator tab and a second device in close proximity to said light-emitting device, said light-emitting device electrically connected to one of said conducting paths via said isolation pad and said second device connected to the other of said conducting paths via said isolation pad, said conducting paths being electrically insulated from each other.

19. The package of claim 18 in which said second device comprises means for modulating said light-emitting device.

20. The package of claim 18 in which said second device comprises means for providing feedback to said light-emitting device.

21. The mount of claim 12 in which said stud and said block consist essentially of copper.

* * * * *